United States Patent
Tseng et al.

(10) Patent No.: US 7,516,385 B2
(45) Date of Patent: Apr. 7, 2009

(54) TEST SEMICONDUCTOR DEVICE IN FULL FREQUENCY WITH HALF FREQUENCY TESTER

(75) Inventors: Chih-Chiang Tseng, Fremont, CA (US); Hsin-Ley Suzanne Chen, San Jose, CA (US); Jae-Hyeong Kim, San Ramon, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 301 days.

(21) Appl. No.: 11/414,612

(22) Filed: Apr. 28, 2006

(65) Prior Publication Data
US 2007/0266286 A1   Nov. 15, 2007

(51) Int. Cl.
*G01R 31/28* (2006.01)
(52) U.S. Cl. ...................................... 714/744
(58) Field of Classification Search ................. 714/724, 714/731, 738, 744
See application file for complete search history.

(56) References Cited

U.S. PATENT DOCUMENTS

| | | | |
|---|---|---|---|
| 4,706,015 A | 11/1987 | Chen | 324/64 |
| 4,876,515 A | 10/1989 | Ball | 324/538 |
| 5,915,107 A | 6/1999 | Maley et al. | 395/551 |
| 6,163,864 A | 12/2000 | Bhavsar et al. | 714/727 |
| 6,297,653 B1 | 10/2001 | Hembree | 324/755 |
| 6,636,066 B2 | 10/2003 | Shimoda | 324/765 |
| 6,642,763 B2 | 11/2003 | Dike | 327/202 |
| 6,760,857 B1* | 7/2004 | Lau et al. | 713/500 |
| 6,836,144 B1 | 12/2004 | Bui et al. | 326/32 |
| 6,880,117 B2* | 4/2005 | Lin et al. | 714/718 |
| 7,029,932 B1 | 4/2006 | Hiser et al. | 438/14 |
| 7,093,177 B2* | 8/2006 | West et al. | 714/738 |
| 7,202,724 B2 | 4/2007 | Kim | 327/218 |
| 7,219,283 B2 | 5/2007 | Whetsel | 714/727 |
| 7,228,476 B2* | 6/2007 | Scipioni et al. | 714/733 |
| 7,242,737 B2 | 7/2007 | Lake et al. | 375/372 |
| 7,253,656 B2 | 8/2007 | Costa et al. | 326/30 |
| 7,254,793 B2 | 8/2007 | Chen et al. | 716/5 |
| 7,308,592 B2* | 12/2007 | Schmunkamp et al. | 713/400 |
| 7,317,773 B2 | 1/2008 | Young et al. | 375/354 |
| 2002/0170003 A1* | 11/2002 | Hirabayashi | 714/42 |
| 2003/0043926 A1* | 3/2003 | Terashima et al. | 375/257 |
| 2005/0190640 A1 | 9/2005 | Braceras et al. | 365/233 |
| 2006/0279304 A1 | 12/2006 | Kuitani et al. | 324/761 |
| 2007/0300111 A1* | 12/2007 | Rausch et al. | 714/731 |

* cited by examiner

*Primary Examiner*—James C Kerveros
(74) *Attorney, Agent, or Firm*—Haverstock & Owens LLP

(57) ABSTRACT

An integrated circuit comprises a double frequency clock generator and a double input generator to test semiconductor devices at frill frequency using a half frequency tester. A clock generator circuit and a test data generator circuit provides differential clock and test data signals at a normal (1× mode) and high-speed rate (2× mode) to a device under test. In 1× mode, clock generator and test data generator circuits pass through the differential clock signals and test data values provided by a testing device unchanged. In 2× mode, the clock generator circuit receives the differential clock signal as clock signals clk and clkb and outputs clock signals clk_int and clkb_int that are inverted signals and twice the frequency of clk and clkb. The test data generator circuit clocks test data values into registers according to clk_int and clkb_int to generate an increased number of test data values per clock signal clk.

48 Claims, 6 Drawing Sheets ic circuit in Full Frequency with Half Frequency Tester

FIELD OF THE INVENTION

The present invention relates to the field of semiconductor testing devices. More particularly, the present invention relates to the field of testing semiconductor devices at full frequency using a half frequency tester.

BACKGROUND OF THE INVENTION

As performance speeds of integrated circuits (ICs) continue to increase, the ability to test such high-speed devices becomes more difficult. In particular, high-speed ICs are very challenging to test because very often the high-speed IC is capable of operating faster than the testing device. One of the solutions to overcome such testing device limitations is to build a frequency multiplier on-chip. Conventionally, this has been performed by fabricating a complicated, on-chip phase-locked loop (PLL) circuit. However, such a solution adds both complexity and cost to the fabrication process.

SUMMARY OF THE INVENTION

An integrated circuit includes a double frequency clock generator and a double input generator to test semiconductor devices at full frequency using a half frequency tester. A clock generator circuit and a test data generator circuit provides differential clock signals and test data signals at a normal rate (1× mode) and a high speed rate (2× mode) to a device under test. In the 1× mode, the clock generator circuit and the test data generator circuit pass through the differential clock signals and test data values provided by a testing device unchanged. In the 2× mode, the clock generator circuit receives the differential clock signal as a clock signal clk and a clock signal clkb 90 degrees out of phase, and outputs a clock signal clk_int and a clock signal clkb_int that are inverted signals of each other and that are twice the frequency of the clock signal clk and the clock signal clkb. In the 2× mode, the test data generator circuit receives the test data values from the testing device and clocks the test data values into registers according to the clock signal clk_int and the clock signal clkb_int in order to generate an increased number of test data values per the clock signal clk.

In one aspect, a testing circuit includes a clock generator circuit configured to receive a first differential clock signal including a first clock signal frequency, wherein the clock generator circuit is configured to generate a second differential clock signal including a second clock signal frequency greater than the first clock signal frequency, and a test data generator circuit configured to receive a first test data signal including a first number of test data values per the first clock signal frequency, and coupled to the clock generator circuit to receive the second differential clock signal, wherein the test data generator circuit is configured to generate a second test data signal including a second number of test data values per the first clock signal frequency, wherein the second number is greater than the first number. The first differential clock signal can include a first clock signal and a second clock signal, and the second differential clock signal can include a third clock signal and a fourth clock signal, wherein the second clock signal is phase-shifted relative to the first clock signal, and the fourth clock signal is phase-shifted relative to the third clock signal. The first clock signal and the second clock signal can be phase-shifted 90 degrees. The third clock signal and the fourth clock signal can be phase-shifted 180 degrees. The clock generator circuit can comprise an exclusive-OR gate configured to input the first clock signal and the second clock signal, and to output the third clock signal, and the clock generator circuit can further comprise an exclusive-NOR gate configured to input the first clock signal and the second clock signal, and to output the fourth clock signal. The test data generator circuit can comprise a plurality of registers, each register clocked according to the third clock signal or the fourth clock signal. The testing circuit can be configured to operate in a standard speed mode and a high-speed mode. The first clock signal frequency can equal the second clock signal frequency and the first number equals the second number in the standard speed mode. The second clock signal frequency can be greater than the first clock signal frequency and the second number can be greater than the first number in the high-speed mode. The clock generator circuit can comprise one or more multiplexors configured to operate in the standard speed mode or the high speed mode, and the test data generator circuit can comprise one or more multiplexors configured to operate in the standard speed mode or the high-speed mode. The first clock signal and the second clock signal can be phase-shifted 180 degrees when the testing circuit is configured to operate in the standard speed mode. The second differential clock frequency can be twice the first differential clock frequency, and the second number is twice the first number. The first number of test data values per the first clock signal frequency can be equal to the second number of test data values per the second clock signal frequency. The test data generator circuit can comprise an inverter, and the second test data signal can comprise the first data signal including the first number of test data values and an inverted first data signal including an inverted first number of test data values. The test data generator circuit can be configured to receive a third test data signal including the first number of test data values per the first clock signal frequency such that the second test data signal comprises the first data signal including the first number of test data values and a phase-shifted first data signal including the first number of test data values.

In another aspect, a testing circuit includes a clock generator circuit configured to receive a first differential clock signal including a first clock signal and a second clock signal, each of the first clock signal and the second clock signal include a first clock frequency, and the second clock signal is phase-shifted ninety degrees relative to the first clock signal, wherein the clock generator circuit is configured to generate a second differential clock signal including a third clock signal and a fourth clock signal, each of the third clock signal and the fourth clock signal includes a second clock signal frequency that is twice the first clock signal frequency, and the fourth clock signal is phase-shifted one hundred eighty degrees relative to the third clock signal, and a test data generator circuit coupled to the clock generator circuit to receive the third clock signal and the fourth clock signal, wherein the test data generator circuit is configured to receive a first test data signal including two test data values per the first clock signal frequency and to generate a second test data signal including four test data values per the first clock signal frequency.

In yet another aspect, a system to test a device under test is described. The system includes a testing device, a testing circuit, and a device under test. The testing device is configured to provide a first differential clock signal including a first clock signal frequency and a first test data signal including a first number of test data values per the first clock signal frequency. The testing circuit comprises a clock generator circuit coupled to the testing device to receive the first differential clock signal, wherein the clock generator circuit is configured to generate a second differential clock signal including a second clock signal frequency greater than the first clock signal frequency, and a test data generator circuit coupled to the testing device to receive the first test data signal and coupled to the clock generator circuit to receive the second differential clock signal, wherein the test data generator circuit is configured to generate a second test data signal including a second number of test data values per the first clock signal frequency, wherein the second number is greater than the first number. The device under test is coupled to the test data generator circuit to receive the second test data signal. The first differential clock signal can include a first clock signal and a second clock signal, and the second differential clock signal can include a third clock signal and a fourth clock signal, wherein the second clock signal is phase-shifted relative to the first clock signal, and the fourth clock signal is phase-shifted relative to the third clock signal. The first clock signal and the second clock signal can be phase-shifted 90 degrees. The third clock signal and the fourth clock signal can be phase-shifted 180 degrees. The clock generator circuit can comprise an exclusive-OR gate configured to input the first clock signal and the second clock signal, and to output the third clock signal, and the clock generator circuit can further comprise an exclusive-NOR gate configured to input the first clock signal and the second clock signal, and to output the fourth clock signal. The test data generator circuit can comprise a plurality of registers, each register clocked according to the third clock signal or the fourth clock signal. The testing circuit can be configured to operate in a standard speed mode and a high-speed mode. The first clock signal frequency can equal the second clock signal frequency and the first number equals the second number in the standard speed mode. The second clock signal frequency can be greater than the first clock signal frequency and the second number can be greater than the first number in the high-speed mode. The clock generator circuit can comprise one or more multiplexors configured to operate in the standard speed mode or the high speed mode, and the test data generator circuit can comprise one or more multiplexors configured to operate in the standard speed mode or the high-speed mode. The first clock signal and the second clock signal can be phase-shifted 180 degrees when the testing circuit is configured to operate in the standard speed mode. The second differential clock frequency can be twice the first differential clock frequency, and the second number can be twice the first number. The first number of test data values per the first clock signal frequency can be equal to the second number of test data values per the second clock signal frequency. The test data generator circuit can comprise an inverter, and the second test data signal can comprise the first data signal including the first number of test data values and an inverted first data signal including an inverted first number of test data values. The test data generator circuit can be configured to receive a third test data signal including the first number of test data values per the first clock signal frequency such that the second test data signal comprises the first data signal including the first number of test data values and a phase-shifted first data signal including the first number of test data values.

In another aspect, a method of testing a device under test is described. The method includes receiving a first differential clock signal from a testing device, wherein the first differential clock signal includes a first clock signal frequency, generating a second differential clock signal including a second clock signal frequency greater than the first clock signal frequency, receiving a first test data signal from the testing device, wherein the first test data signal includes a first number of test data values per the first clock signal frequency, generating a second test data signal according to the first test data signal and the second differential clock signal, wherein the second test data signal includes a second number of test data values per the first clock signal frequency, further wherein the second number is greater than the first number, and providing the second test data signal to a device under test. Generating the second differential clock signal can include generating a third clock signal and a fourth clock signal phase-shifted relative to each other. The first differential clock signal can include a first clock signal and a second clock signal phase-shifted relative to each other. The first clock signal and the second clock signal can be phase-shifted 90 degrees. The third clock signal and the fourth clock signal can be phase-shifted 180 degrees. The method can also include selecting between a standard speed mode of operation and a high-speed mode of operation. The first clock signal frequency can equal the second clock signal frequency and the first number can equal the second number in the standard speed mode. The second clock signal frequency can be greater than the first clock signal frequency and the second number can be greater than the first number in the high-speed mode. The first clock signal and the second clock signal can be phase-shifted 180 degrees when the testing circuit is configured to operate in the standard speed mode. The second differential clock frequency can be twice the first differential clock frequency, and the second number is twice the first number. The first number of test data values per the first clock signal frequency can be equal to the second number of test data values per the second clock signal frequency. Generating the second test data signal can comprise generating a third test data signal and a fourth test data signal, wherein the third test data signal comprises the first test data signal including the first number of test data values and the fourth test signal comprises an inverted first data test signal including an inverted first number of test data values. The method can also include receiving a third test data signal including the first number of test data values per the first clock signal frequency. Generating the second test data signal can comprise generating a fourth test data signal and a fifth test data signal such that the fourth test data signal comprises the first test data signal and the fifth test data signal includes a phase-shifted first data signal.

BRIEF DESCRIPTION OF THE DRAWINGS

Embodiments of the testing circuit are described relative to the several views of the drawings. Where appropriate and only where identical elements are disclosed and shown in more than one drawing, the same reference numeral will be used to represent such identical elements.

DETAILED DESCRIPTION OF THE EMBODIMENTS

Figure 1:
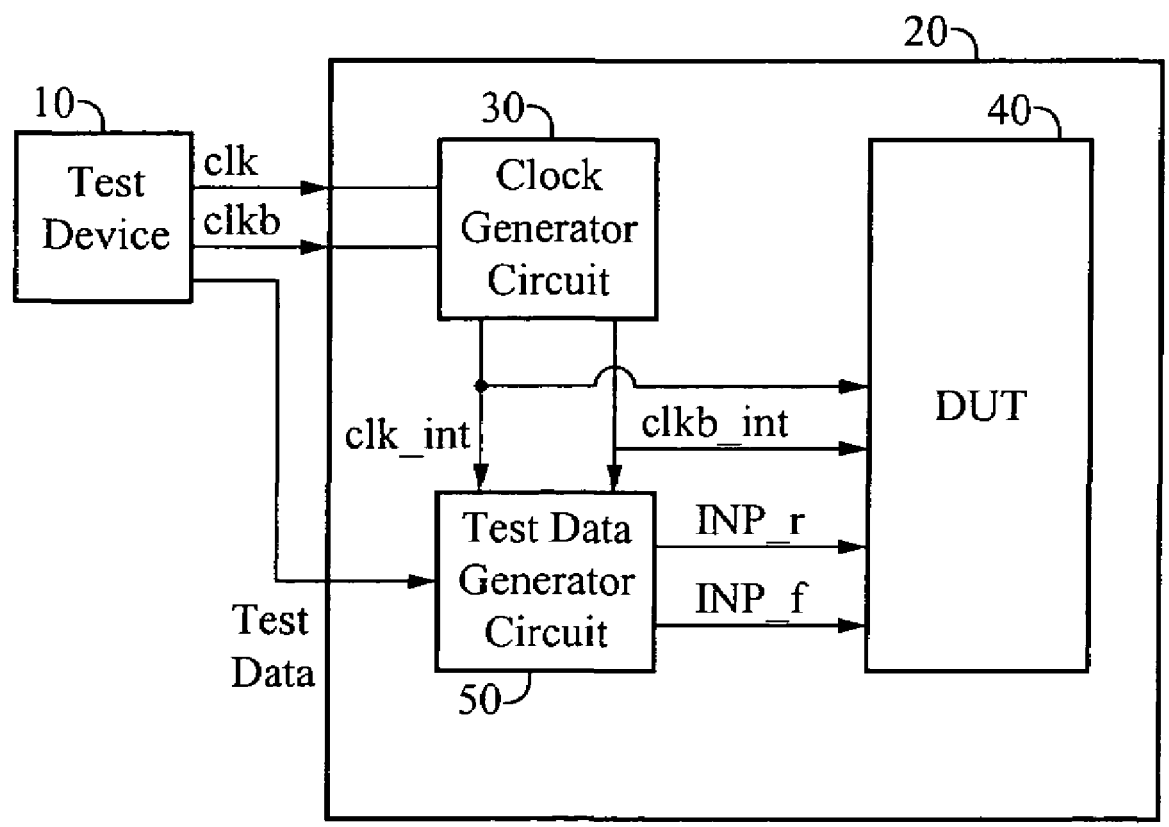
FIG. 1 illustrates an exemplary block diagram of a system for doubling the frequency of the test signals provided to a device under test by a testing device.

FIG. 1 illustrates an exemplary block diagram of a system for doubling the frequency of the test signals provided to a device under test 40 by a testing device 10. The testing device 10 is any conventional testing device used to perform one or more tests related to the performance of a device. The testing device 10 is configured to output a first clock signal clk and a second clock signal clkb. The testing device 10 is also configured to output test data values. The device under test 40 is an integrated circuit or a high-speed integrated circuit. A clock generator circuit 30 is coupled to the testing device 10 to receive the first clock signal clk and the second clock signal clkb. The clock generator circuit 30 is configured to output a third clock signal clk_int and a fourth clock signal clkb_int. A test data generator circuit 50 is coupled to the clock generator circuit 30 to receive the third clock signal clk_int and the fourth clock signal clkb_int. The test data generator circuit 50 is also coupled to the testing device 10 to receive the test data values. The test data generator circuit 50 is configured to output the first input test data values INP_r and the second input test data values INP_f. The device under test 40 is coupled to the clock generator circuit 30 to receive the third clock signal clk_int and the fourth clock signal clkb_int. The device under test 40 is also coupled to the test data generator circuit 50 to receive the first input test data values INP_r and the second input test data values INP_f. In one embodiment, the clock generator circuit 30 and the test data generator circuit 50 are configured on the same integrated circuit 20 as the device under test 40. Alternatively, the clock generator circuit and the test data generator circuit are configured separately than the device under test.

The clock generator circuit 30 and the test data generator circuit 50 are dynamically configurable to operate in one of two modes, a 1× mode and a 2× mode. In the 1× mode, the clock generator circuit 30 receives the first clock signal clk and the second clock signal clkb and passes these two clock signals unchanged as the third clock signal clk_int and the fourth clock signal clkb_int. In this case, the output third clock signal clk_int is the same as the input first clock signal clk, and the output fourth clock signal clkb_int is the same as the input second clock signal clkb. In the 2× mode, the clock generator circuit 30 receives the first clock signal clk and the second clock signal clkb, doubles the frequency of these two clock signals, and outputs the increased frequency clock signals as the third clock signal clk_int and the fourth clock signal clkb_int. In this case, the output third clock signal clk_int is twice the frequency as the input first clock signal clk, and the output fourth clock signal clkb_int is twice the frequency as the input second clock signal clkb.

Figure 2:
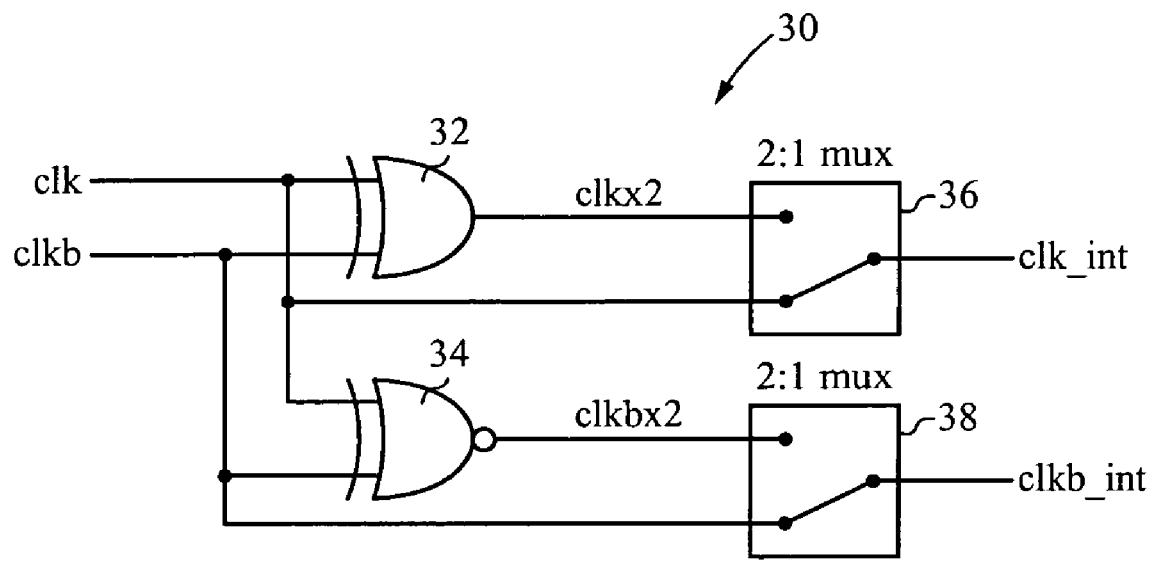
FIG. 2 illustrates a functional block diagram of the clock generator circuit configured according to the 1× mode.
Figure 3:
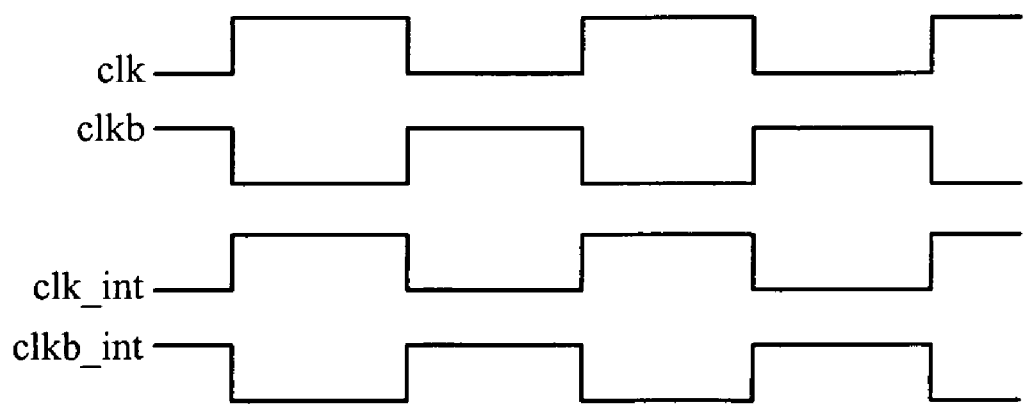
FIG. 3 illustrates the waveforms associated with the clock generator circuit configured according to FIG. 2.

FIG. 2 illustrates a functional block diagram of the clock generator circuit 30 configured according to the 1× mode. FIG. 3 illustrates the waveforms associated with the clock generator circuit 30 configured according to FIG. 2. The clock generator circuit 30 includes an exclusive-OR (XOR) gate 32, an exclusive-NOR (XNOR) gate 34, a multiplexer (MUX) 36, and a MUX 38. The MUX 36 and the MUX 38 are each 2:1 multiplexors that receive two input signals and output one of the two input signals according to an externally provided control signal. The clock signal clk is provided as a first input signal to the XOR gate 32, and the clock signal clkb is provided as a second input signal to the XOR gate 32. As shown in FIG. 3, the clock signal clk and the clock signal clkb are 180 degrees out of phase. The XOR gate 32 outputs a clock signal clkx2. The clock signal clkx2 is received as a first input signal by the MUX 36. The MUX 36 also receives the clock signal clk as a second input signal. The clock signal clk is also provided as a first input signal to the XNOR gate 34. The clock signal clkb is also provided as a second input signal to the XNOR gate 34. The XNOR gate 34 outputs a clock signal clkbx2. The clock signal clkbx2 is received as a first input signal by the MUX 38. The MUX 38 also receives the clock signal clkb as a second input signal.

When the clock generating circuit 30 is configured according to the 1× mode, the MUX 36 selects the second input signal provided to the MUX 36, which is the clock signal clk. The signal output by the MUX 36 is the clock signal clk_int, which in the 1× mode is the same as the clock signal clk, as is shown in FIG. 3. Also, when the clock generating circuit 30 is configured in the 1× mode, the MUX 38 selects the second input signal provided to the MUX 38, which is the clock signal clkb. The signal output by the MUX 38 is the clock signal clkb_int, which in the 1× mode is the same as the clock signal clkb, as is shown in FIG. 3.

Figure 4:
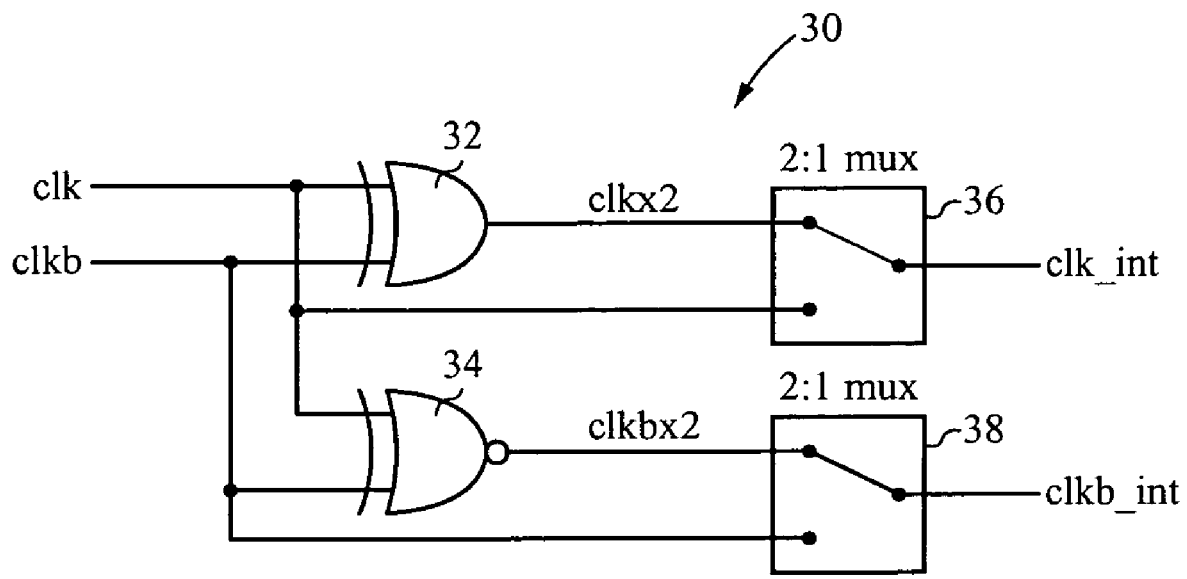
FIG. 4 illustrates a functional block diagram of the clock generator circuit configured according to the 2× mode.
Figure 5:
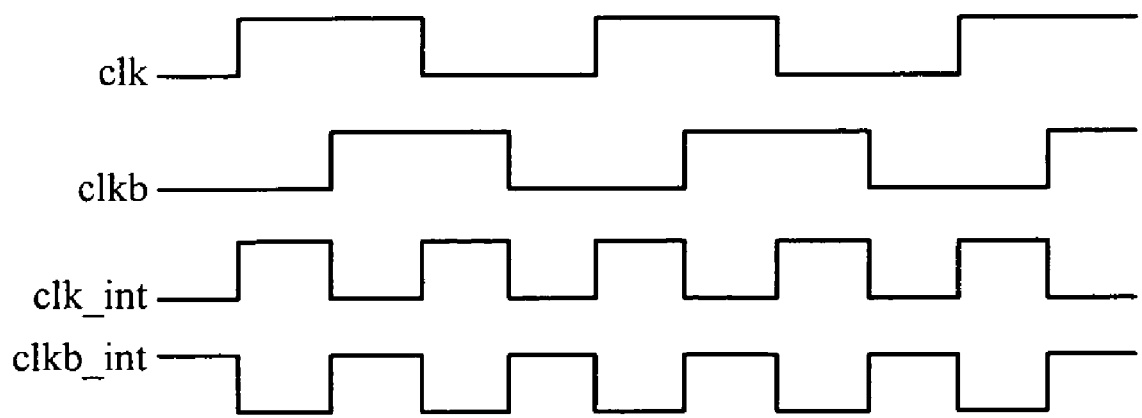
FIG. 5 illustrates the waveforms associated with the clock generator circuit configured according to FIG. 4.

FIG. 4 illustrates a functional block diagram of the clock generator circuit 30 configured according to the 2× mode. FIG. 5 illustrates the waveforms associated with the clock generator circuit 30 configured according to FIG. 4. When the clock generating circuit 30 is configured according to the 2× mode, the clock signal clkb is phase shifted by 90 degrees relative to the clock signal clk, as opposed to the phase shift of 180 degrees when operating in the 1× mode. In the 2× mode, the MUX 36 selects the first input signal provided to the MUX 36, which is the clock signal clkx2 output from the XOR gate 32. The signal output by the MUX 36 is the clock signal clk_int, which in the 2× mode is twice the frequency as the clock signal clk, as is shown in FIG. 5. Also, when the clock generating circuit 30 is configured in the 2× mode, the MUX 38 selects the first input signal provided to the MUX 38, which is the clock signal clkbx2 output from the XNOR gate 34. The signal output by the MUX 38 is the clock signal clkb_int, which in the 2× mode is twice the frequency as the clock signal clkb, as is shown in FIG. 5.

The MUX 36 and the MUX 38 enable the clock generator circuit 30 to operate in a standard mode (1× mode) in which the frequency of the clock signal provided by the testing device 10 is sufficient to test the device under test 40. The MUX 36 and the MUX 38 also enable the clock generator circuit 30 to operate in a high-speed mode (2× mode) in which the frequency of the clock signal provided by the testing device 10 is not sufficient to test the device under test 40, and the clock generator circuit 30 generates a clock signal with a frequency that is sufficient to test the device under test 40.

To test the device under test 40, a differential clock signal and test data are necessary. Conventional testing devices are configured to provide 2 input test data values per clock cycle. Providing two input test data values per clock cycle is consistent with operating in the 1× mode. However, when operating in the 2× mode, each external clock cycle is doubled in frequency to essentially generate two internal clock cycles per each external clock cycle. In this case, four input test data values are needed for each external clock cycle, thereby providing two for each internal clock cycle. The test data generator circuit 50 is configured to generate four input test data values for each two test data values provided by the testing device 10. The test data generator circuit 50 is configured in one of two ways to generate the four input test data values per external clock cycle.

Figure 6:
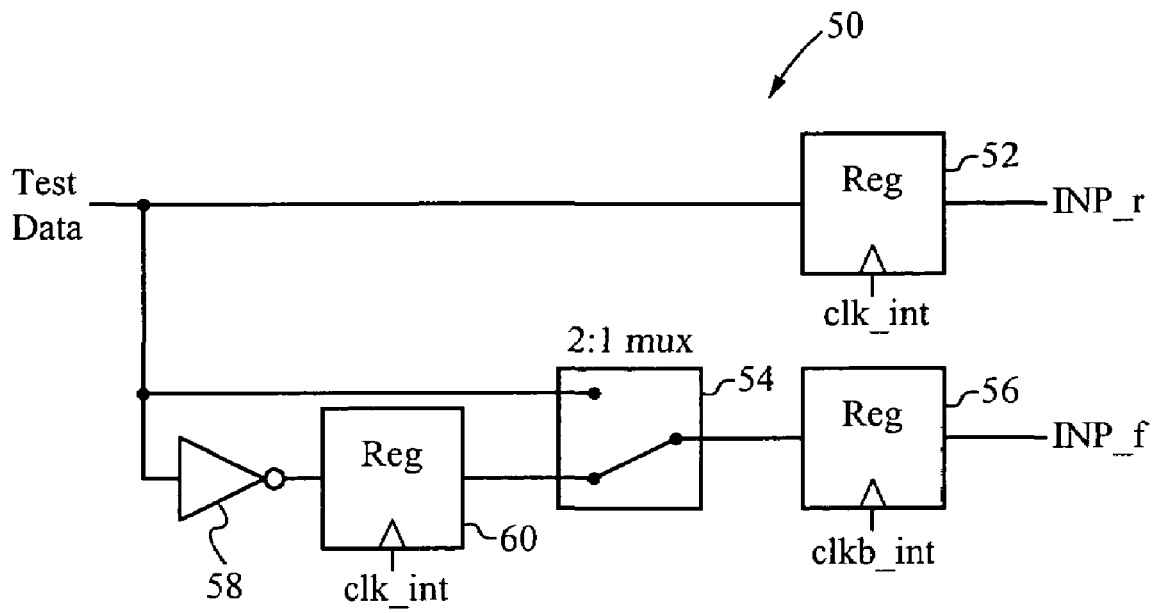
FIG. 6 illustrates a first configuration of the test data generator circuit.
Figure 7:
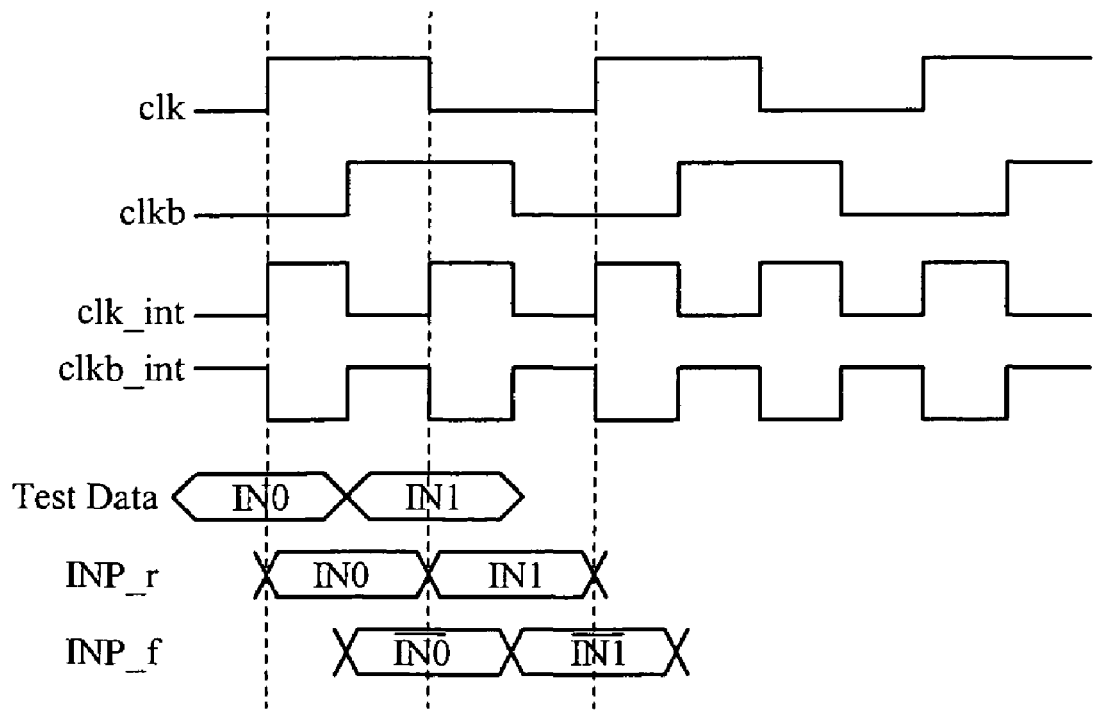
FIG. 7 illustrates the waveforms associated with the test data generator circuit configured according to FIG. 6.

FIG. 6 illustrates a first configuration of the test data generator circuit 50. FIG. 7 illustrates the waveforms associated with the test data generator circuit 50 configured according to FIG. 6. In the first configuration, the test data generator circuit 50 includes a register 52, a 2:1 MUX 54, a register 56, an inverter 58, and a register 60. The test data values from the testing device 10 (FIG. 1) are received by the register 52, the MUX 54, and the inverter 58. The clock signal clk_int provided by the clock generator circuit 30 (FIGS. 2 and 4) is received by the register 52 and the register 60. The clock signal clkb_int provided by the clock generator circuit 30 (FIGS. 2 and 4) is received by the register 56. The inverter 58 provides inverted test data values to the register 60. The MUX 54 is a 2:1 multiplexor that receives two input signals and outputs one of the two input signals according to an externally provided control signal. The MUX 54 receives the test data values from the testing device 10 (FIG. 1) as a first input signal and receives the inverted test data values from the register 60 as a second input signal. The MUX 54 outputs one of the first input signal or the second input signal to the register 56. In the 2× mode, the MUX 54 selects the second input signal provided to the MUX 54, which is the inverted test data signal output from the register 60. The signal output by the MUX 54 is the inverted test data signal. In the 1× mode, the MUX 54 selects the first input signal provided to the MUX 54, which is the test data signal output from the testing device 10 (FIG. 1). The register 56 outputs the test data signal INP_f. The register 52 outputs the test data signal INP_r.

As shown in FIG. 6, the test data generator circuit 50 is configured according to the 2× mode. When the test data generator circuit 50 is configured according to the 2× mode, the clock signal clk_int and the clock signal clkb_int received from the clock generator circuit 30 are 90 degrees out of phase, as is shown in FIG. 7. The test data values provided by the testing device 10 (FIG. 1) are clocked into the register 52 according to the clock signal clk_int. The inverted test data values output from the inverter 58 are clocked into the register 60 according to the clock signal clk_int. The signal output from the MUX 54, which in the 2× mode is the inverted test data signal, is clocked into the register 56 according to the clock signal clkb_int.

The two input test data values per clock cycle that are provided by the testing device 10 (FIG. 1) are shown as test data values IN0 and IN1 in FIG. 7. In the 2× mode, the test data values IN0 and IN1 are serially clocked into and out of the register 52 according to the clock signal clk_int. For example, FIG. 7 shows the test data value IN0 clocked into the register 52 at the falling edge of the clock signal clk_int. At the rising edge of the clock signal clk_int, the test data value IN0 is output from the register 52 as the test data signal INP_r. The next test data value IN1 is clocked into the register 52 at the next change of state of the clock signal clk_int, for example at a falling edge of the clock signal clk_int. Similarly, as the test data value IN0 is clocked into the register 52, the inverted test data value $\overline{IN0}$ is clocked into the register 60. As the test data value IN0 is output from the register 52, the inverted test data value $\overline{IN0}$ is output from the register 60. The next inverted test data value $\overline{IN1}$ is clocked into the register 60 at the next change of state of the clock signal clk_int, for example at a falling edge of the clock signal clk_int. The output from the register 60 passes through the MUX 54, when configured in the 2× mode, and is clocked into the register 56 according to the clock signal clkb_int, for example at a falling edge of the clock signal clkb_int. At the next change of state of the clock signal clkb_int, for example at a rising edge of the clock signal clkb_int, the inverted test data value $\overline{IN0}$ is output from the register 56 as the test data signal INP_f. The next inverted test data value $\overline{IN1}$ is clocked into the register 56 at the next change of state of the clock signal clkb_int, for example at a falling edge of the clock signal clkb_int. As a result of passing the inverted test data values through two registers versus passing the original test data values through only one register, the test data signal INP_f is delayed by 90 degrees relative to the test data signal INP_r.

Figure 8:
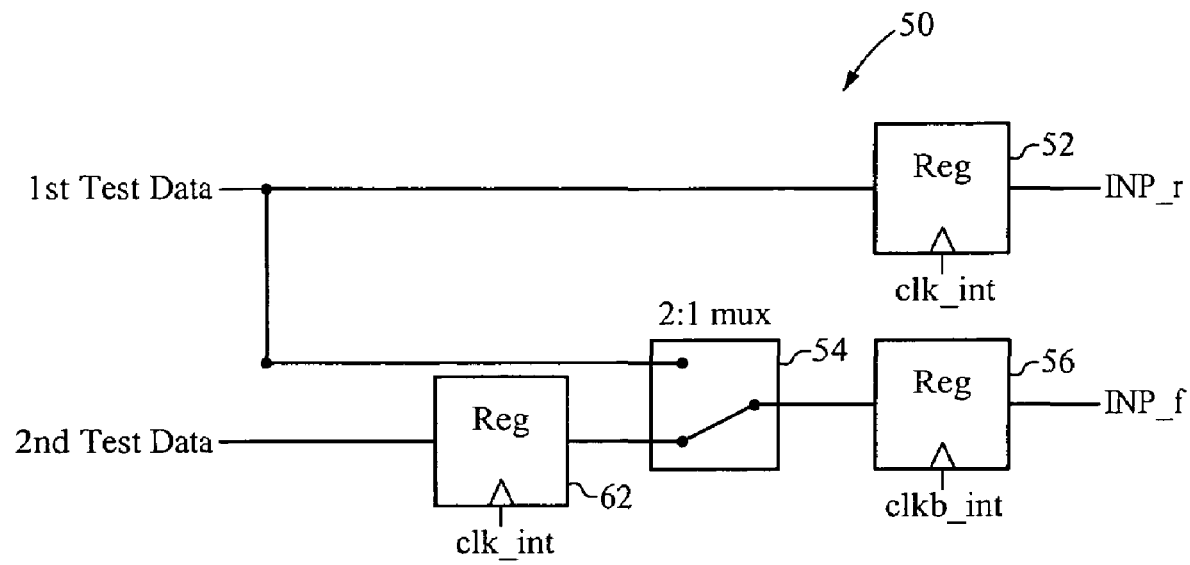
FIG. 8 illustrates a second configuration of the test data generator circuit.
Figure 9:
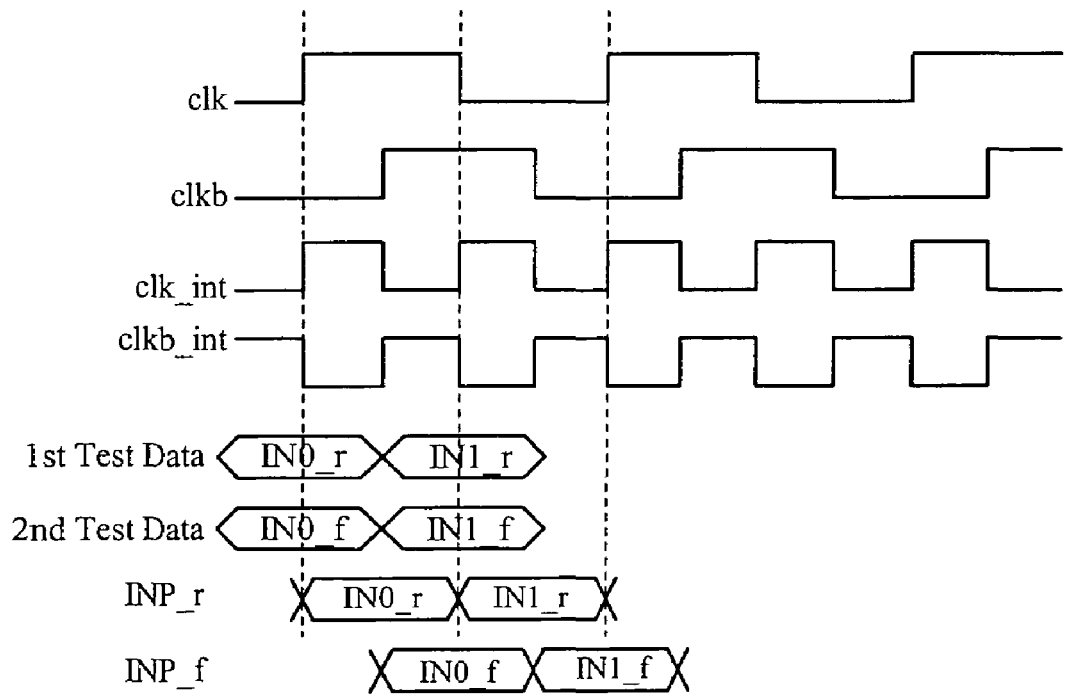
FIG. 9 illustrates the waveforms associated with the test data generator circuit configured according to FIG. 8.

FIG. 8 illustrates a second configuration of the test data generator circuit 50. FIG. 9 illustrates the waveforms associated with the test data generator circuit 50 configured according to FIG. 8. In the second configuration, a second test data input path is provided to the test data generator circuit 50. The second configuration of the test data generator circuit 50 includes the register 52, the 2:1 MUX 54, and the register 56 of the first configuration. The inverter 58 and the register 60 from the first configuration are replaced by a register 62. The second configuration of the test data generator circuit 50 functions similarly as to the first configuration with the exception that the test data values from the testing device 10 (FIG. 1) are received only by the register 52 and the MUX 54. The register 62 receives test data values from the second test data input path. In one embodiment, the test data values provided by the first data input path (from the testing device 10) are the same as the test data values provided by the second test data input path, as is shown in FIG. 9. The clock signal clk_int provided by the clock generator circuit 30 (FIGS. 2 and 4) is received by the register 52 and the register 62. The clock signal clkb_int provided by the clock generator circuit 30 (FIGS. 2 and 4) is received by the register 56. The MUX 54 receives the first test data values from the testing device 10 (FIG. 1) as a first input signal and receives the second test data values from the register 62 as a second input signal. In the 2× mode shown in FIG. 8, the MUX 54 selects the second input signal provided to the MUX 54, which is the second test data signal output from the register 62. The signal output by the MUX 54 is the second test data signal. In the 1× mode, the MUX 54 selects the first input signal provided to the MUX 54, which is the first test data signal output from the testing device 10 (FIG. 1). The register 56 outputs the test data signal INP_f. The register 52 outputs the test data signal INP_r.

As shown in FIG. 8, the test data generator circuit 50 is configured according to the 2× mode. When the test data generator circuit 50 is configured according the 2× mode, the clock signal clk_int and the clock signal clkb_int received from the clock generator circuit 30 are 90 degrees out of phase, as is shown in FIG. 9. The first test data values provided by the testing device 10 (FIG. 1) are clocked into the register 52 according to the clock signal clk_int. The second test data values provided by the second test data input path are clocked into the register 62 according to the clock signal clk_int. The signal output from the MUX 54, which in the 2× mode is the second test data signal, is clocked into the register 56 according to the clock signal clkb_int.

The two input test data values per clock cycle that are provided by the testing device 10 (FIG. 1) are shown as the first test data values IN0_r and IN1_r in FIG. 9. In the 2× mode, the first test data values IN0_r and IN1_r are serially clocked into and out of the register 52 according to the clock signal clk_int. For example, FIG. 9 shows the test data value IN0_r clocked into the register 52 at the falling edge of the clock signal clk_int. At the rising edge of the clock signal clk_int, the test data value IN0_r is output from the register as the test data signal INP_r 52. The next test data value IN1_r is clocked into the register 52 at the next change of state of the clock signal clk_int, for example at a falling edge of the clock signal clk_int. Similarly, as the test data value IN0_r is clocked into the register 52, the second test data value IN0_f is clocked into the register 62. As the first test data value IN0_r is output from the register 52, the second test data value IN0_f is output from the register 62. The next second test data value IN1_f is clocked into the register 62 at the next change of state of the clock signal clk_int, for example at a falling edge of the clock signal clk_int. The output from the register 62 passes through the MUX 54, when configured in the 2× mode, and is clocked into the register 56 according to the clock signal clkb_int, for example at a falling edge of the clock signal clkb_int. At the next change of state of the clock signal clkb_int, for example at a rising edge of the clock signal clkb_int, the second test data value IN0_f is output from the register 56 as the test data signal INP_f. The next second test data value IN1_f is clocked into the register 56 at the next change of state of the clock signal clkb_int, for example at a falling edge of the clock signal clkb_int. As a result of passing the second test data value through two registers versus passing the first test data value through only one register, the test data signal INP_f is delayed by 90 degrees relative to the test data signal INP_r.

In operation, a clock generator circuit and a test data generator circuit provide differential clock signals and test data signals at a normal rate (1× mode) and a high speed rate (2× mode) to a device under test. In the 1× mode, the clock generator circuit passes through the two differential clock signals, the clock signal clk and the clock signal clkb, unchanged. The test data generator circuit receives two test data values per clock signal from the testing device. In the 1× mode, the test data generator circuit passes through the two test data values per clock cycle unchanged. In the 2× mode, the clock generator circuit receives the clock signal clk and the clock signal clkb 90 degrees out of phase, and outputs a clock signal clk_int and a clock signal clkb_int that are inverted signals of each other and that are twice the frequency of the original clock signal clk and the clock signal clkb. In the 2× mode, the test data generator circuit receives the two test data values per clock signal clk and clocks the test data values into registers according to the clock signal clk_int and the clock signal clkb_int in order to generate four test data values per the clock signal clk. In one configuration of the test data generator circuit, an inverter, a register, and a MUX are included to output the two originally input test data values and two inverted test data values per the clock cycle clk. In a second configuration of the test generator circuit, a second test data input path, a register, and a MUX are included to generate two originally input test data values and two phase shifted test data values, phase shifted by 90 degrees relative to the two originally input test data values.

Figure 10:
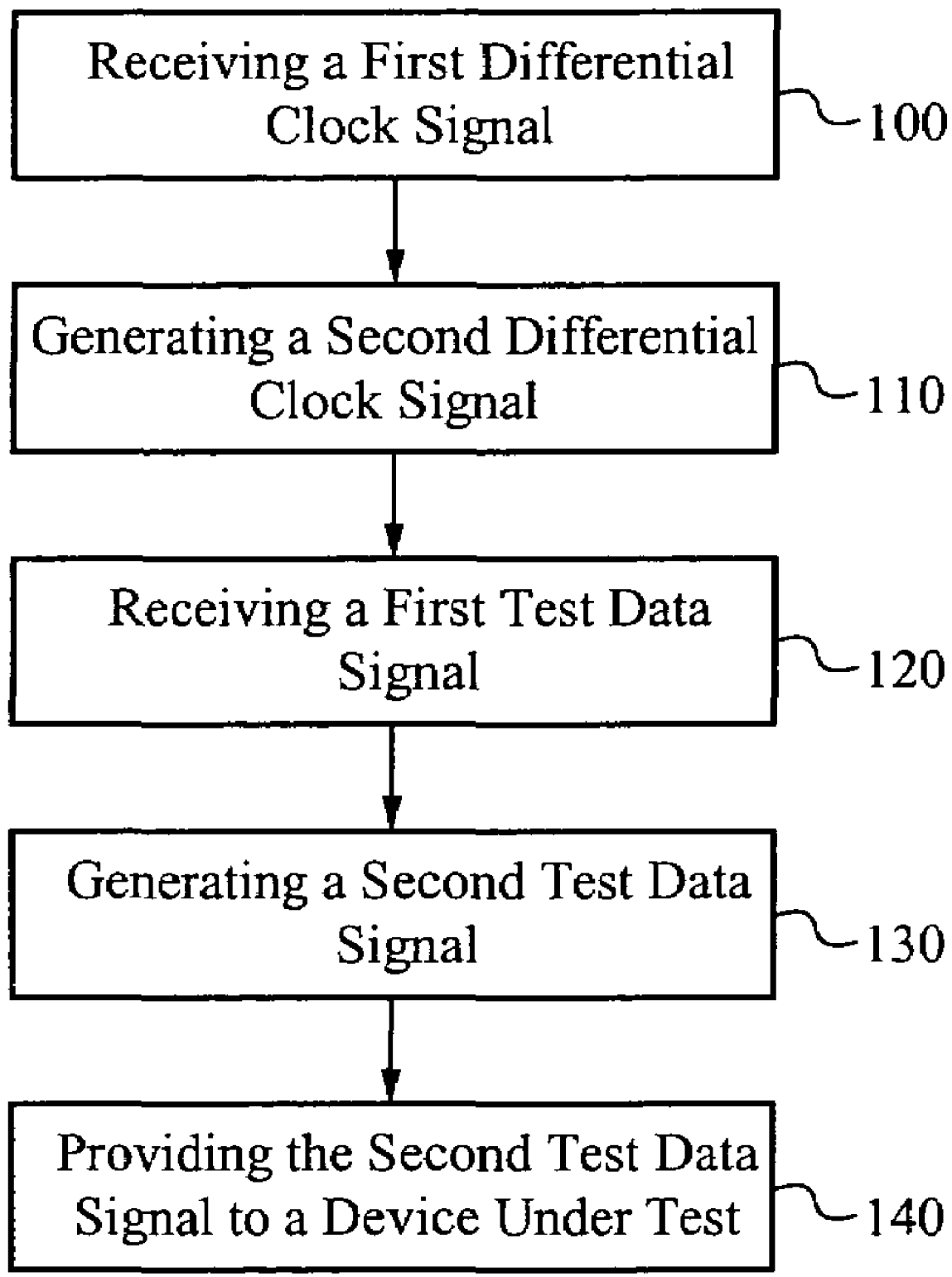
FIG. 10 illustrates a process for testing a device under test.

FIG. 10 illustrates a process for testing a device under test. At the step 100, a first differential clock signal is received from a testing device. At the step 110, a second differential clock signal is generating according to the first differential clock signal. At the step 120, a first test data signal is received from the testing device. At the step 130, a second test data signal is generated according to the first test data signal and the second differential clock signal. At the step 140, the second test data signal is provided to the device under test.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A testing circuit comprising:
   a clock generator circuit configured to receive a first differential clock signal comprising a first clock signal frequency, wherein the clock generator circuit is configured to generate a second differential clock signal comprising a second clock signal frequency greater than the first clock signal frequency; and
   a test data generator circuit configured to receive a first test data signal comprising a first number of test data values according to the first clock signal frequency, and coupled to the clock generator circuit to receive the second differential clock signal, wherein the test data generator circuit is configured to generate from the first test data signal a second test data signal comprising a second number of test data values according to the first clock signal frequency.

2. The testing circuit of claim 1 wherein the first differential clock signal comprises a first clock signal and a second clock signal, and the second differential clock signal comprises a third clock signal and a fourth clock signal, wherein the second clock signal is phase-shifted relative to the first clock signal, and the fourth clock signal is phase-shifted relative to the third clock signal.

3. The testing circuit of claim 2 wherein the first clock signal and the second clock signal are phase-shifted 90 degrees.

4. The testing circuit of claim 3 wherein the third clock signal and the fourth clock signal are phase-shifted 180 degrees.

5. The testing circuit of claim 2 wherein the clock generator circuit comprises an exclusive-OR gate configured to input the first clock signal and the second clock signal, and to output the third clock signal, and the clock generator circuit further comprises an exclusive-NOR gate configured to input the first clock signal and the second clock signal, and to output the fourth clock signal.

6. The testing circuit of claim 2 wherein the test data generator circuit comprises a plurality of registers, each register clocked according to the third clock signal or the fourth clock signal.

7. The testing circuit of claim 2 wherein the testing circuit is configured to operate in a standard speed mode and a high-speed mode.

8. The testing circuit of claim 7 wherein the first clock signal frequency equals the second clock signal frequency and the first number equals the second number in the standard speed mode.

9. The testing circuit of claim 8 wherein the second clock signal frequency is greater than the first clock signal frequency and the second number is greater than the first number in the high-speed mode.

10. The testing circuit of claim 9 wherein the clock generator circuit comprises one or more multiplexors configured to operate in the standard speed mode or the high speed mode, and the test data generator circuit comprises one or more multiplexors configured to operate in the standard speed mode or the high-speed mode.

11. The testing circuit of claim 7 wherein the first clock signal and the second clock signal are phase-shifted 180 degrees when the testing circuit is configured to operate in the standard speed mode.

12. The testing circuit of claim 1 wherein the second differential clock frequency is twice the first differential clock frequency, and the second number of test data values is twice the first number of test data values.

13. The testing circuit of claim 1 wherein the first number of test data values according to the first clock signal frequency is equal to the second number of test data values.

14. The testing circuit of claim 1 wherein the test data generator circuit comprises an inverter, and the second test data signal comprises the first data signal comprising the first number of test data values and an inverted first data signal comprising an inverted first number of test data values.

15. The testing circuit of claim 1 wherein the test data generator circuit is configured to receive a third test data signal comprising the first number of test data values according to the first clock signal frequency such that the second test data signal comprises the first data signal comprising the first number of test data values and a phase-shifted first data signal comprising the first number of test data values.

16. A testing circuit comprising:
   a clock generator circuit configured to receive a first differential clock signal comprising a first clock signal and a second clock signal, each of the first clock signal and the second clock signal include a first clock frequency, and the second clock signal is phase-shifted ninety degrees relative to the first clock signal, wherein the clock generator circuit is configured to generate a second differential clock signal comprising a third clock signal and a fourth clock signal, each of the third clock signal and the fourth clock signal comprises a second clock signal frequency that is twice the first clock signal frequency, and the fourth clock signal is phase-shifted one hundred eighty degrees relative to the third clock signal; and
   a test data generator circuit coupled to the clock generator circuit to receive the third clock signal and the fourth clock signal, wherein the test data generator circuit is configured to receive a first test data signal comprising two test data values according to the first clock signal frequency and to generate from the first test data signal a second test data signal comprising four test data values according to the first clock signal frequency.

17. A system to test a device under test, the system comprising:
   a testing device configured to provide a first differential clock signal comprising a first clock signal frequency and a first test data signal comprising a first number of test data values according to the first clock signal frequency;
   a testing circuit comprising:
      a clock generator circuit coupled to the testing device to receive the first differential clock signal, wherein the clock generator circuit is configured to generate a second differential clock signal comprising a second clock signal frequency greater than the first clock signal frequency; and
      a test data generator circuit coupled to the testing device to receive the first test data signal and coupled to the clock generator circuit to receive the second differential clock signal, wherein the test data generator circuit is configured to generate from the first test data signal a second test data signal comprising a second number of test data values according to the first clock signal frequency; and
   a device under test coupled to the test data generator circuit to receive the second test data signal.

18. The system of claim 17 wherein the first differential clock signal comprises a first clock signal and a second clock signal, and the second differential clock signal comprises a third clock signal and a fourth clock signal, wherein the second clock signal is phase-shifted relative to the first clock signal, and the fourth clock signal is phase-shifted relative to the third clock signal.

19. The system of claim 18 wherein the first clock signal and the second clock signal are phase-shifted 90 degrees.

20. The system of claim 19 wherein the third clock signal and the fourth clock signal are phase-shifted 180 degrees.

21. The system of claim 18 wherein the clock generator circuit comprises an exclusive-OR gate configured to input the first clock signal and the second clock signal, and to output the third clock signal, and the clock generator circuit further comprises an exclusive-NOR gate configured to input the first clock signal and the second clock signal, and to output the fourth clock signal.

22. The system of claim 18 wherein the test data generator circuit comprises a plurality of registers, each register clocked according to the third clock signal or the fourth clock signal.

23. The system of claim 18 wherein the testing circuit is configured to operate in a standard speed mode and a high-speed mode.

24. The system of claim 23 wherein the first clock signal frequency equals the second clock signal frequency and the first number of test data values equals the second number of test data values in the standard speed mode.

25. The system of claim 24 wherein the second clock signal frequency is greater than the first clock signal frequency and the second number of test data values is greater than the first number of test data values in the high-speed mode.

26. The system of claim 25 wherein the clock generator circuit comprises one or more multiplexors configured to operate in the standard speed mode or the high speed mode, and the test data generator circuit comprises one or more multiplexors configured to operate in the standard speed mode or the high-speed mode.

27. The system of claim 23 wherein the first clock signal and the second clock signal are phase-shifted 180 degrees when the testing circuit is configured to operate in the standard speed mode.

28. The system of claim 17 wherein the second differential clock frequency is twice the first differential clock frequency, and the second number of test data values is twice the first number of test data values.

29. The system of claim 17 wherein the first number of test data values according to the first clock signal frequency is equal to the second number of test data values.

30. The system of claim 17 wherein the test data generator circuit comprises an inverter, and the second test data signal comprises the first data signal comprising the first number of test data values and an inverted first data signal comprising an inverted first number of test data values.

31. The system of claim 17 wherein the test data generator circuit is configured to receive a third test data signal comprising the first number of test data values according to the first clock signal frequency such that the second test data signal comprises the first data signal comprising the first number of test data values and a phase-shifted first data signal comprising the first number of test data values.

32. A method of testing a device under test, the method comprising:
   receiving a first differential clock signal from a testing device, wherein the first differential clock signal comprises a first clock signal frequency;
   generating a second differential clock signal comprising a second clock signal frequency greater than the first clock signal frequency;

receiving a first test data signal from the testing device, wherein the first test data signal comprises a first number of test data values according to the first clock signal frequency;

generating a second test data signal according to the first test data signal and the second differential clock signal, wherein the second test data signal comprises a second number of test data values according to the first clock signal frequency; and providing the second test data signal to a device under test.

33. The method of claim 32 wherein generating the second differential clock signal comprises generating a third clock signal and a fourth clock signal phase-shifted relative to each other.

34. The method of claim 33 wherein the first differential clock signal comprises a first clock signal and a second clock signal phase-shifted relative to each other.

35. The method of claim 34 wherein the first clock signal and the second clock signal are phase-shifted 90 degrees.

36. The method of claim 35 wherein the third clock signal and the fourth clock signal are phase-shifted 180 degrees.

37. The method of claim 33 further comprising selecting between a standard speed mode of operation and a high-speed mode of operation.

38. The method of claim 37 wherein the first clock signal frequency equals the second clock signal frequency and the first number of test data values equals the second number of test data values in the standard speed mode.

39. The method of claim 38 wherein the second clock signal frequency is greater than the first clock signal frequency and the second number of test data values is greater than the first number of test data values in the high-speed mode.

40. The method of claim 38 wherein the first clock signal and the second clock signal are phase-shifted 180 degrees when the testing circuit is configured to operate in the standard speed mode.

41. The method of claim 32 wherein the second differential clock frequency is twice the first differential clock frequency, and the second number of test data values is twice the first number of test data values.

42. The method of claim 32 wherein the first number of test data values according to the first clock signal frequency is equal to the second number of test data values.

43. The method of claim 32 wherein generating the second test data signal comprises generating a third test data signal and a fourth test data signal, wherein the third test data signal comprises the first test data signal comprising the first number of test data values and the fourth test signal comprises an inverted first data test signal comprising an inverted first number of test data values.

44. The method of claim 32 further comprising receiving a third test data signal comprising the first number of test data values according to the first clock signal frequency.

45. The method of claim 44 wherein generating the second test data signal comprises generating a fourth test data signal and a fifth test data signal such that the fourth test data signal comprises the first test data signal and the fifth test data signal comprises a phase-shifted first data signal.

46. A testing circuit comprising:
a clock generator circuit coupled to receive a first differential clock signal comprising a first clock signal frequency, wherein the clock generator circuit generates a second differential clock signal comprising a second clock signal frequency greater than the first clock signal frequency; and
a test data generator circuit coupled to receive a first test data signal comprising a first number of test data values according to the first clock signal frequency, and coupled to the clock generator circuit to receive the second differential clock signal, wherein the test data generator circuit generates from the first test data signal, a second test data signal comprising a second number of test data values according to the first clock signal frequency.

47. A testing circuit comprising:
a clock generator circuit coupled to receive a first differential clock signal comprising a first clock signal, a second clock signal and a first clock signal frequency, the second clock signal phase-shifted relative to the first clock signal, wherein the clock generator circuit generates a second differential clock signal comprising a third clock signal, a fourth clock signal and a second clock signal frequency greater than the first clock signal frequency, the fourth clock signal phase-shifted relative to the third clock signal; and
a test data generator circuit coupled to receive a first test data signal comprising a first number of test data values according to the first clock signal frequency, and coupled to the clock generator circuit to receive the second differential clock signal, wherein the test data generator circuit generates from the first test data signal, a second test data signal comprising a second number of test data values according to the first clock signal frequency.

48. A method of testing a device under test, the method comprising:
receiving a first differential clock signal from a testing device, wherein the first differential clock signal comprises a first clock signal, a second clock signal and a first clock signal frequency, the second-clock signal phase-shifted relative to the first clock signal;
generating a second differential clock signal comprising a third clock signal, a fourth clock signal and a second clock signal frequency greater than the first clock signal frequency, the fourth clock signal phase-shifted relative to the third clock signal;
receiving a first test data signal from the testing device, wherein the first test data signal comprises a first number of test data values according to the first clock signal frequency;
generating a second test data signal according to the first test data signal and the second differential clock signal, wherein the second test data signal comprises a second number of test data values according to the first clock signal frequency; and
providing the second test data signal to a device under test.

* * * * *

UNITED STATES PATENT AND TRADEMARK OFFICE
CERTIFICATE OF CORRECTION

PATENT NO. : 7,516,385 B2 Page 1 of 1
APPLICATION NO. : 11/414612
DATED : April 7, 2009
INVENTOR(S) : Tseng et al.

It is certified that error appears in the above-identified patent and that said Letters Patent is hereby corrected as shown below:

Title Page Item [57]

On the cover, in the Abstract, please replace "provides" with "provide" so that the corresponding sentence reads
-- A clock generator circuit and a test data generator circuit provide differential clock and test data signals at a normal (1x mode) and high-speed rate (2x mode) to a device under test. --

At column 6, line 39, please replace the "elk" with "clk" so that the corresponding sentence reads
-- The signal output by the MUX 36 is the clock signal clk_int, which in the 2X mode is twice the frequency as the clock signal clk, as is shown in Figure 5. --

Signed and Sealed this

Second Day of June, 2009

JOHN DOLL
*Acting Director of the United States Patent and Trademark Office*